United States Patent [19]

Kersuzan et al.

[11] Patent Number: 4,563,543
[45] Date of Patent: Jan. 7, 1986

[54] ULTRA HIGH-FREQUENCY CIRCUIT WITH METALLIZED THROUGH HOLE

[75] Inventors: Georges Kersuzan, Verrieres le Buisson; Michel Picault, Paris; Roland Sourdillon, Meudon la Foret, all of France

[73] Assignee: U.S. Philips Corporation, New York, N.Y.

[21] Appl. No.: 576,173

[22] Filed: Feb. 2, 1984

Related U.S. Application Data

[63] Continuation of Ser. No. 371,086, Apr. 23, 1982, abandoned.

[30] Foreign Application Priority Data

Apr. 29, 1981 [FR] France ............................ 81 08548

[51] Int. Cl.⁴ .............................................. H05K 1/09
[52] U.S. Cl. ..................................... 174/68.5; 427/97; 428/901
[58] Field of Search .................... 427/97; 428/901; 174/68.5; 29/852

[56] References Cited

U.S. PATENT DOCUMENTS 3,799,802 3/1974 Schneble, Jr. et al. ............ 427/97 X
4,001,146 1/1977 Horowitz ............................ 252/514
4,069,963 1/1978 Prasad ................................. 228/179
4,131,516 12/1978 Bakos et al. ....................... 427/97 X

FOREIGN PATENT DOCUMENTS 54-53267 4/1979 Japan.

OTHER PUBLICATIONS

Harper, Charles A., *Handbook of Thick Film Hybrid Microelectronics*, McGraw-Hill, 1974, pp. 4-34 and 4-35.

*Primary Examiner*—Evan K. Lawrence
*Attorney, Agent, or Firm*—Robert J. Kraus

[57] ABSTRACT

An ultra high frequency circuit formed on an insulating plate having first and second surfaces on opposite sides and having at least one hole formed through the plate and defined by a side wall connecting the surfaces. The side wall is covered by a deposition including overlapping layers of gold and gold-platinum for connecting, respectively, a gold connection track on the one surface with a silver alloy conductive layer. The overlapping gold/gold-platinum layers provide metallurgically-stable interfaces with the gold connection track and the silver alloy conductive layer. This prevents a metallurgically unstable condition which would exist if the gold connection track were directly connected to the silver alloy conductive layer.

6 Claims, 5 Drawing Figures

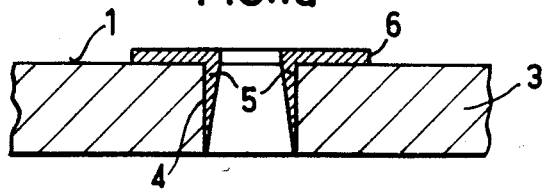
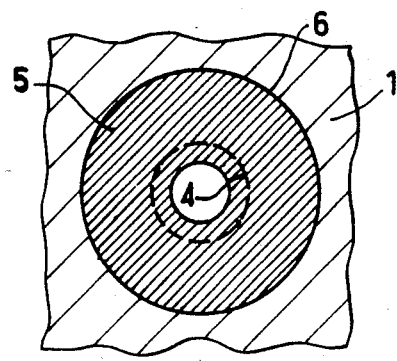
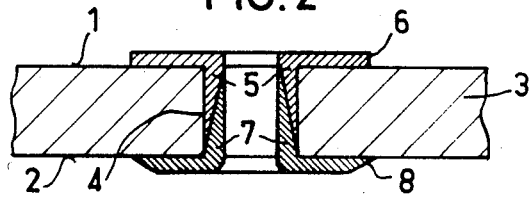
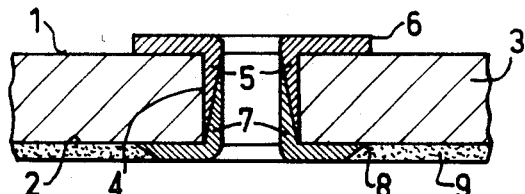
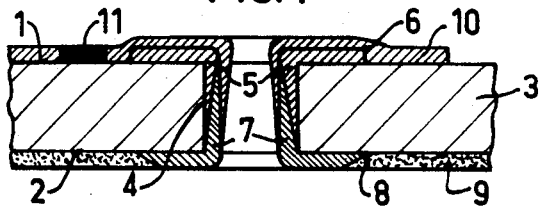

ULTRA HIGH-FREQUENCY CIRCUIT WITH METALLIZED THROUGH HOLE

This is a continuation of application Ser. No. 371,086, filed Apr. 23, 1982, now abandoned.

BACKGROUND OF THE INVENTION

The invention relates to ultra high frequency hybrid circuits including silk-screen printed circuitry on an insulating aluminium oxide plate. A first surface of the plate serves as a support for a circuit comprising conductive connection tracks of gold and a second surface serves as a support for a conductive layer. Connection between the circuit and the conductive layer is effected by means of wall-metallized holes in the plate.

The conductive connection tracks of the circuit, the metallization of the holes and the conductive layer are generally obtained by silk-screen printing gold deposits. If the circuit comprises components such as resistors, these are also produced by silk-screen printing. Other components can be provided on the circuit according to "hybrid" technology.

SUMMARY OF THE INVENTION

It is an object of the invention to produce an ultra high-frequency circuit of the above-described type, but which is more economical because the gold of the conductive layer can be replaced by an alloy of silver. Because the conductive layer constitutes the most significant gold deposit, an appreciable economy may thus be realized. However, it is difficult to ensure the connection of the conductive layer to the conductive connection tracks of the circuit, because silver diffuses into gold and the interface between these two metals is metallurgically unstable. In accordance with the invention this difficulty is avoided by forming the conductive layer by depositing an alloy of silver and connecting the layer to the conduction tracks by a metallization on the wall of each of the holes comprising an alloy which is compatible with both the gold of the conductive connection tracks and with the silver alloy of the conductive layer.

If the conductive layer is formed from an alloy of silver-palladium and if the connection to the conductive layer is made by an alloy of gold-platinum, the system thus realized is metallurgically stable because the gold-platinum forms a barrier to the diffusion of silver in gold.

BRIEF DESCRIPTION OF THE DRAWING

From the following description, with reference to the accompanying exemplary drawing, it will be well understood how the invention can be realized.

FIGS. 1a to 4 show the successive stages of manufacture of an ultra high-frequency circuit in accordance with the invention.

DESCRIPTION OF THE PREFERRED EMBODIMENT

FIGS. 1a and 1b are a cross-sectional view and a plan view, respectively, of an aluminum oxide plate 3 having parallel surfaces and a hole 4 in the plate. A gold-metallization 5 is deposited by silk-screen printing on one of the surfaces 1 of the plate and on the hole side wall, starting from a circumference 6 which is concentric with the hole 4. To metallize it optimally, the gold deposition is dried and fired.

In the following step shown in FIG. 2 a metallization of gold-platinum 7 is deposited on the preceding metallization of gold on the side wall of the hole by silk-screen printing on the surface 2 of the plate starting from a circumference 8 which is concentric with the hole 4. To metallize it optimally, the deposition of gold-platinum is dried and fired.

As shown in FIG. 3, a deposition is then carried out by silk-screen printing of silver-palladium, forming the conductive layer 9 on the whole surface 2 of the plate and in a manner such as to obtain a partial coating of the metallization of gold-platinum 7 which lies on the surface 2. The deposition of silver-palladium is dried and fired.

FIG. 4 shows the finished device completed in the last step of the manufacture by depositing gold by silk-screen printing on the surface 1 of the plate to form the conductive connection tracks 10. The tracks entirely cover the part of the gold-metallization 5 which lies outside of the hole, and partially cover the metallization of gold-platinum 7 on the inside of the hole. Optionally, each resistor 11 of the circuit is deposited by silk-screen printing, making the circuit ready to receive the other components. The depositions of gold of the connections and of resistive paste are also dried and fired.

What is claimed is:

1. An ultra high frequency circuit comprising an insulating plate having first and second surfaces on opposite sides and having a hole formed through the plate and defined by a side wall extending between said surfaces, said circuit including a conductive connection track on the first surface, a conductive layer on the second surface, of a material which would form a metallurgically-unstable interface with the conductive connection track material, and a deposition on said side wall including a connecting layer in contact with the conductive connection track and the conductive layer, said connecting layer consisting essentially of an electrically-conductive alloy which forms metallurgically-stable interfaces with both the material of the conductive connection track and the material of the conductive layer.

2. A circuit as in claim 1 where the conductive connection track consists essentially of gold, the conductive layer consists essentially of a silver alloy, and the connecting layer consists essentially of gold-platinum.

3. A circuit as in claim 1 or 2 where part of said deposition is formed by a second layer in contact with the connecting layer and the conductive connection track, said second layer consisting essentially of a metal which forms metallurgically-stable interfaces with the materials of said connecting layer and said conductive connection track.

4. A circuit as in claim 2 where part of said deposition is formed by a second layer, consisting essentially of gold, in contact with the connecting layer and the conductive connection track.

5. A circuit as in claim 1 where the conductive connection track extends into the hole and overlies at least part of the connecting layer.

6. An ultra high frequency circuit comprising an insulating plate having first and second surfaces on opposite sides and having a hole formed through the plate and defined by a side wall extending between said surfaces, said circuit including a conductive connection track of a first material on the first surface, a conductive layer of a second material, which would form a metallurgically-unstable interface with the first material, on the second surface, and an electrically-conductive deposition on said side wall including first and second portions in contact with the first and second materials, respectively, said portions each consisting of a material which forms a metallurgically-stable interface with said material with which it is in contact.

* * * * *